(12) United States Patent
Huang et al.

(10) Patent No.: US 9,705,045 B2
(45) Date of Patent: Jul. 11, 2017

(54) LIGHT EMITTING DIODE HAVING DISTRIBUTED BRAGG REFLECTORS (DBR) AND MANUFACTURING METHOD THEREOF

(71) Applicant: Genesis Photonics Inc., Tainan (TW)

(72) Inventors: Yi-Ru Huang, Tainan (TW);
Kuan-Chieh Huang, New Taipei (TW);
Chih-Ming Shen, Tainan (TW);
Tung-Lin Chuang, Tainan (TW);
Hung-Chuan Mai, Kaohsiung (TW);
Jing-En Huang, Tainan (TW);
Shao-Ying Ting, Tainan (TW)

(73) Assignee: GENESIS PHOTONICS INC., Tainan (TW)

( * ) Notice: Subject to any disclaimer, the term of this patent is extended or adjusted under 35 U.S.C. 154(b) by 0 days.

(21) Appl. No.: 15/045,488

(22) Filed: Feb. 17, 2016

(65) Prior Publication Data
US 2016/0240744 A1 Aug. 18, 2016

Related U.S. Application Data

(60) Provisional application No. 62/116,923, filed on Feb. 17, 2015, provisional application No. 62/148,761, filed on Apr. 17, 2015.

(51) Int. Cl.
*H01L 33/46* (2010.01)
*H01L 33/52* (2010.01)
(Continued)

(52) U.S. Cl.
CPC .............. *H01L 33/46* (2013.01); *H01L 33/10* (2013.01); *H01L 33/44* (2013.01); *H01L 33/50* (2013.01);
(Continued)

(58) Field of Classification Search
CPC ......... H01L 33/50; H01L 33/46; H01L 33/10; H01L 33/44
(Continued)

(56) References Cited

U.S. PATENT DOCUMENTS

| 4,112,455 A | 9/1978 | Seliger et al. |
| 5,696,389 A | 12/1997 | Ishikawa et al. |

(Continued)

FOREIGN PATENT DOCUMENTS

| KR | 2012041646 A | 5/2012 |
| KR | 101169036 B1 | 7/2012 |

OTHER PUBLICATIONS

Non-Final Office Action issued in U.S. Appl. No. 15/045,265, filed Feb. 17, 2016, mailed Aug. 1, 2016.
(Continued)

*Primary Examiner* — Thomas L Dickey
*Assistant Examiner* — Changhyun Yi
(74) *Attorney, Agent, or Firm* — McClure, Qualey & Rodack, LLP

(57) ABSTRACT

A light emitting diode (LED) having distributed Bragg reflector (DBR) and a manufacturing method thereof are provided. The distributed Bragg reflector is used as a reflective element for reflecting the light generated by the light emitting layer to an ideal direction of light output. The distributed Bragg reflector has a plurality of through holes, such that the metal layer and the transparent conductive layer disposed on two sides of the distributed Bragg reflector may contact each other to conduct the current. Due to the distribution properties of the through holes, the current may be more uniformly diffused, and the light may be more uniformly emitted from the light emitting layer.

4 Claims, 7 Drawing Sheets

(51) Int. Cl.
  *H01L 33/38* (2010.01)
  *H01L 33/62* (2010.01)
  *H01L 33/50* (2010.01)
  *H01L 33/44* (2010.01)
  *H01L 33/10* (2010.01)

(52) U.S. Cl.
  CPC ...... *H01L 33/62* (2013.01); *H01L 2933/0025* (2013.01)

(58) Field of Classification Search
  USPC .......................................................... 257/98
  See application file for complete search history.

(56) References Cited

U.S. PATENT DOCUMENTS

| | | | |
|---|---|---|---|
| 8,138,518 | B2 | 3/2012 | Tsai et al. |
| 8,283,692 | B2 | 10/2012 | Lim et al. |
| 8,664,684 | B2 | 3/2014 | Schubert |
| 8,754,438 | B2 | 6/2014 | Lin et al. |
| 8,829,549 | B2 | 9/2014 | Huang et al. |
| 9,006,775 | B1 * | 4/2015 | Kuo ...................... H01L 33/382 257/100 |
| 9,040,328 | B2 | 5/2015 | Lin et al. |
| 9,196,797 | B2 | 11/2015 | Lo et al. |
| 9,287,461 | B2 | 3/2016 | Hsiao et al. |
| 2008/0157115 | A1 | 7/2008 | Chuang et al. |
| 2009/0152583 | A1 | 6/2009 | Chen et al. |
| 2010/0072487 | A1 | 3/2010 | Tsai et al. |
| 2011/0012152 | A1 | 1/2011 | Lim et al. |
| 2012/0049756 | A1 | 3/2012 | Schubert |
| 2012/0061704 | A1 | 3/2012 | Jeong et al. |
| 2012/0211788 | A1 | 8/2012 | Yuh et al. |
| 2012/0223355 | A1 | 9/2012 | Asakawa et al. |
| 2013/0001508 | A1 | 1/2013 | Lin et al. |
| 2014/0001434 | A1 | 1/2014 | Chen |
| 2014/0225150 | A1 | 8/2014 | Hsiao et al. |
| 2014/0231852 | A1 | 8/2014 | Suh et al. |
| 2014/0242738 | A1 | 8/2014 | Lin et al. |
| 2015/0236215 | A1 | 8/2015 | Park et al. |
| 2015/0318443 | A1 | 11/2015 | Suh et al. |
| 2016/0126413 | A1 | 5/2016 | Kim et al. |
| 2016/0126423 | A1 | 5/2016 | Jung et al. |

OTHER PUBLICATIONS

Kim, et al.: "Electrical, optical, and structural properties of indium-tin-oxide thin films for organic light-emitting devices"; Journal of Applied Physics; vol. 86, No. 11 Dec. 1, 1999; pp. 6451-6461.
Non-Final Office Action issued in U.S. Appl. No. 15/045,263, filed Feb. 17, 2016, mailed Jan. 9, 2017.
Non-Final Office Action issued in U.S. Appl. No. 15/135,574, filed Apr. 22, 2016, mailed Jan. 9, 2017.
File History for U.S. Appl. No. 15/255,161, filed Sep. 2, 2016.

* cited by examiner

LIGHT EMITTING DIODE HAVING DISTRIBUTED BRAGG REFLECTORS (DBR) AND MANUFACTURING METHOD THEREOF

This application claims the benefit of U.S. Provisional application Ser. No. 62/116,923, filed Feb. 17, 2015, and the benefit of U.S. Provisional application Ser. No. 62/148,761, filed Apr. 17, 2015, the disclosure of which are incorporated by reference herein in its entirety.

TECHNICAL FIELD

The disclosure relates in general to a light emitting diode (LED) and manufacturing method thereof, and more particularly to an LED having distributed Bragg reflector (DBR).

BACKGROUND

Light emitting diode (LED) is a solid-state light emitting element formed of a semiconductor material normally composed of III-V group chemical elements such as gallium phosphide, gallium arsenide, or gallium nitride. When a voltage is applied to the compound semiconductor, electrode voltage will make a large amount of electron holes and a large amount of electrons meet together to form electron-hole recombination on the light emitting layer. Meanwhile, the electrons will degenerate to a lower energy level and will be released in the form of photons. Thus, electrical energy is converted into optical energy and emits a light.

In order to increase the luminance of light output, the LED further includes a reflective structure for reflecting the light generated by the light emitting layer to an ideal direction of light output. Conventional reflective structure is a silver mirror which may go through phase change when the silver mirror is affected by temperature during the manufacturing process. When the silver mirror changes to liquid state, the silver may diffuse to the peripheral. Therefore, the edge of silver mirror cannot be aligned with the edge of other layer of the LED, and must be slightly indented and covered with a barrier layer normally formed of titanium tungsten.

In a conventional LED, the silver mirror and the barrier material are stacked together to from a reflective element; therefore the manufacturing process becomes very complicated. Moreover, the stability of the silver mirror is an issue that needs to be considered. Therefore, there are many issues that can be improved.

SUMMARY

According to the main object of the present invention, an LED having distributed Bragg reflector is provided. Conventional silver mirror is replaced with distributed Bragg reflector, such that the unstable factors caused by the silver mirror may be avoided and product yield may be increased accordingly.

According to another object of the present invention, an LED having distributed Bragg reflector is provided. A plurality of through holes are formed in the distributed Bragg reflector for the current to flow through. Moreover, the uniformity of current distribution may be adjusted using the distribution of the through holes.

According to an alternate object of the present invention, a manufacturing method of LED having distributed Bragg reflector is provided. The manufacturing method reduces the steps and complexity of conventional manufacturing process.

Thus, the present invention discloses an LED having distributed Bragg reflector and a manufacturing method thereof. The LED having distributed Bragg reflector includes an epitaxial layer, a transparent conductive layer, at least one Bragg reflective layer, a first electrode, and a second electrode. The epitaxial layer has a first semiconductor layer, a light emitting layer and a second semiconductor layer. The transparent conductive layer is disposed on the second semiconductor layer. The at least one Bragg reflective layer is disposed on the transparent conductive layer and has a plurality of first through holes penetrating through the Bragg reflective layer. The first electrode is electrically connected to the first semiconductor layer. The second electrode is electrically connected to the transparent conductive layer.

In another embodiment of the present invention, the LED having distributed Bragg reflector includes a plurality of current blocking layers interposed between the epitaxial layer and the transparent conductive layer.

In an alternate embodiment of the present invention, the insulating layer and the Bragg reflective layer are integrated owing to the insulating properties of the Bragg reflective layer.

The above and other aspects of the invention will become better understood with regard to the following detailed description of the preferred but non-limiting embodiment (s). The following description is made with reference to the accompanying drawings.

DETAILED DESCRIPTION

The above and other objects, features and effects of the present invention will be more clearly understood from the following detailed descriptions disclosed in embodiments below.

Figure 1:
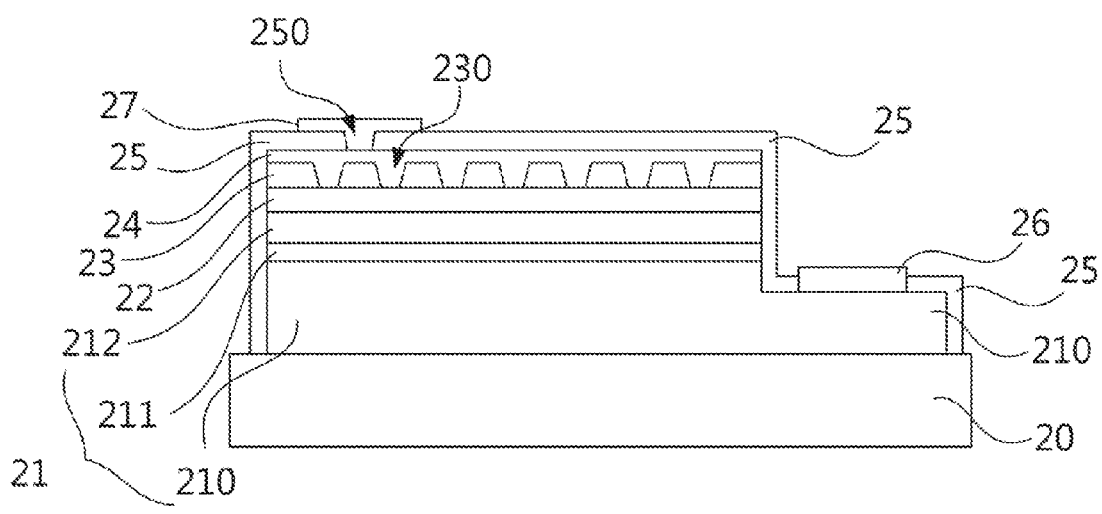
FIG. 1 is a structural cross-sectional view of an epitaxial layer and reflective structures disposed thereon according to an embodiment of the present invention.
Figure 2:
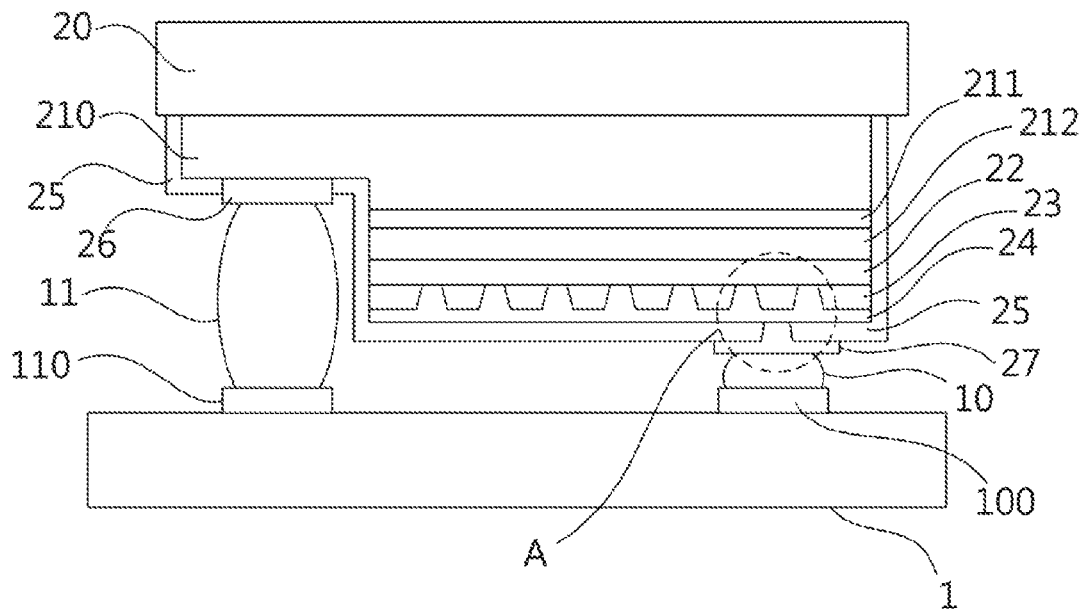
FIG. 2 is a structural cross-sectional view according to an embodiment of the present invention.

Referring to both FIG. 1 and FIG. 2. The LED disclosed in an embodiment of the present invention includes an epitaxial layer 21, a transparent conductive layer 22, at least one Bragg reflective layer 23, a metal layer 24, an insulating layer 25, a first electrode 26 and a second electrode 27. The epitaxial layer 21 may be disposed on a surface of a light permeable substrate 20. The epitaxial layer 21 includes a first semiconductor layer 210, a light emitting layer 211 and a second semiconductor layer 212 stacked in sequence. The transparent conductive layer 22 is disposed on the second semiconductor layer 212 of the epitaxial layer 21. The Bragg reflective layer 23 is disposed on the transparent conductive layer 22, and has a plurality of first through holes 230 penetrating through the Bragg reflective layer 23. The metal layer 24 is disposed on the Bragg reflective layer 23 and the transparent conductive layer 22, and is electrically connected to the transparent conductive layer 22 via the first through holes 230. The insulating layer 25 is disposed on the metal layer 24, and has at least one second through hole 250 exposing a part of the metal layer 24. The first electrode 26 is electrically connected to the first semiconductor layer 210 of the epitaxial layer 21. The second electrode 27 is disposed on the insulating layer 25 and is electrically connected to the metal layer 24 via the second through hole 250.

Figure 3:
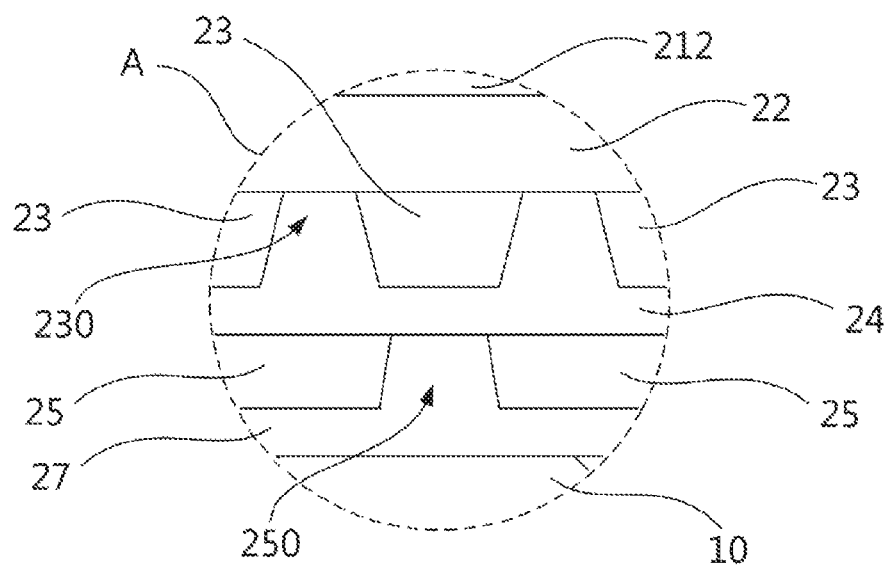
FIG. 3 is a partial enlargement of the region A of FIG. 2 according to an embodiment of the present invention.

Apart from the structure disclosed above, in actual application of LED, the first electrode 26 and the second electrode 27 are electrically connected to the circuit board 1 via the conductive bumps 10 and 11, respectively. The surface of the circuit board 1 has circuit contacts 100 and 110 interconnected with the conductive bumps 10 and 11. FIG. 3 is a partial enlargement of the region A of FIG. 2. As indicated in FIG. 3, the current may flow through the second electrode 27, the metal layer 24 and the transparent conductive layer 22 through the first through holes 230 and the second through hole 250 without being blocked by the Bragg reflective layer 23 or the insulating layer 25. The Bragg reflective layer 23 and the insulating layer 25 both have insulating properties.

The LED of the present invention is an application of flip-chip LED, and is characterized in that overall luminance is enhanced through the disposition of the Bragg reflective layer. The Bragg reflective layer 23 may reflect the light generated by the light emitting layer 211 of the epitaxial layer 21. Since the light emitting layer 211 has an omnidirectional emission, the light would proceed in a direction opposite to the ideal direction of light output if the light is not reflected by the Bragg reflective layer 23. The optical efficiency of LED may be effectively increased through the reflection of the light. The reflected light may firstly pass through structures such as the transparent conductive layer 22 and the epitaxial layer 21 and then penetrate through the light permeable substrate 20.

Figure 4:
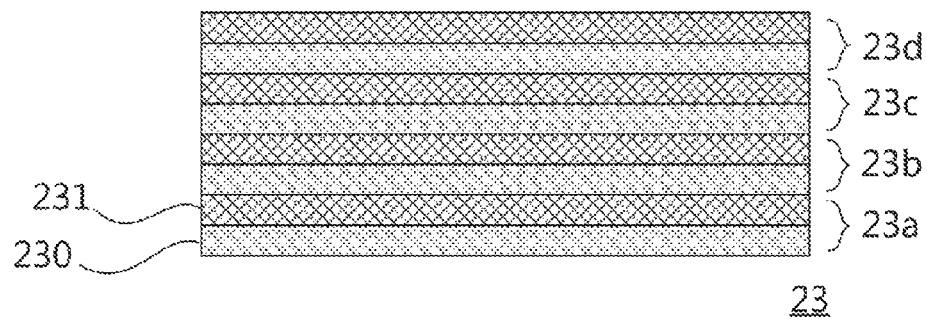
FIG. 4 is a partial structure diagram of a Bragg reflective layer having at least four sub-layers formed by repeatedly stacking the first reflective material and the second reflective material according to an embodiment of the present invention.

Referring to FIG. 4. The Bragg reflective layer 23 in an embodiment of the present invention includes at least four sub-layers 23a, 23b, 23c and 23d, wherein each sub-layer is a structure formed by stacking at least two types of reflective materials having different reflectivities. Through repetitive stacking of the first reflective material 230 and the second reflective material 231, the reflectivity of the Bragg reflective layer 23 may have a periodic change. Such a reflective structure with alternating reflectivities allows the light to form constructive interference at the entrance and cause a very high reflectivity. In the present embodiment of the present invention, the Bragg reflective layer 23 has at least sub-layers 23a, 23b, 23c and 23d formed through four repetitions of stacking. The overall reflective structure has a reflectivity larger than 80%. The reflective structure may be formed of commonly seen materials GaAs/AlGaAs having closer lattice constants and easier to form stacking or may be formed of $TiO_2$, $Ta_2O_5$, $Nb_2O_5$, $SiO_2$, $Si_3N_4$, ZnSe, $MgF_2$ or $CaF_2$. The materials are sequentially stacked according to their reflectivity. For example, the materials are stacked in the sequence of $SiO_2/TiO_2$, $SiO_2/Ta_2O_5$, $SiO_2/Nb_2O_5$, ZnSe/$MgF_2$. However, the present invention does not restrict the types of reflective material.

Figure 5:
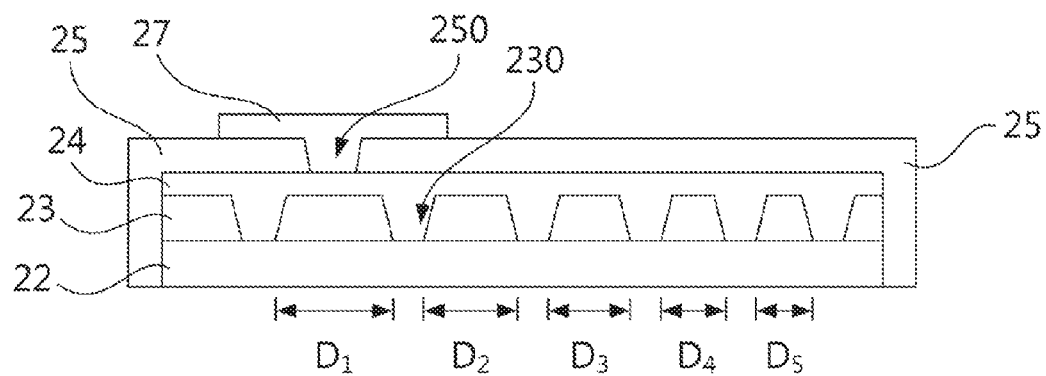
FIG. 5 is a partial structure diagram illustrating some intervals between the first through holes are negatively correlated with the distances between the first through holes and the second electrode according to another embodiment of the present invention.

Apart from providing reflective function, the Bragg reflective layer of the present invention may be used for diffusing the current if the Bragg reflective layer is formed of an insulating material. Referring to FIG. 5. In actual application of flip-chip LED, the region of the light emitting layer near the P-type electrode has more currents passing through, hence having better photoelectric conversion and generating more optical energy. Therefore, in another embodiment of the present invention, the distribution of the first through holes 230 formed in the Bragg reflective layer 23 may affect the current path and distribution of the currents. Referring to FIG. 5. In a distribution example, the intervals $D_1$-$D_5$ between the first through holes 230 do not have a fixed value. Furthermore, the intervals $D_1$-$D_5$ between the first through holes 230 gradually decrease as the distances between the first through holes 230 and the second electrode 27 gradually increase. That is, the density of the first through holes 230 gradually increases as the first through holes 230 are located farther away from the second electrode 27. As disclosed above, the region of the light emitting layer near P-type electrode has more currents passing through. In the present embodiment of the present invention, the density of the first through holes 230 gradually increases as the first through holes 230 are located farther away from the second electrode 27, such that the currents may be diffused and reach the transparent conductive layer 22 more uniformly, and the light emitting layer 211 may have uniform emission.

Figure 6:
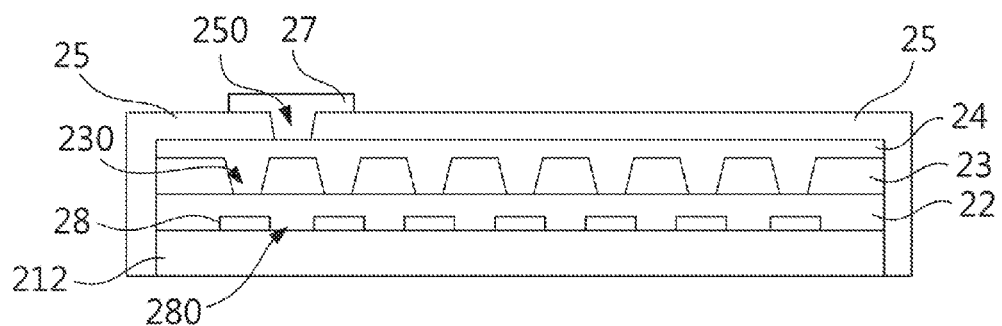
FIG. 6 is a partial structure diagram illustrating the uniformity of current distribution is enhanced by using current blocking layers according to an alternate embodiment of the present invention.

Referring to FIG. 6, an alternate embodiment for enhancing current diffusion is shown. As indicated in FIG. 6, a plurality of current blocking layers 28 are further disposed on the second semiconductor layer 212. A plurality of third through holes 280 are formed in the current blocking layers 28 and expose a part of the second semiconductor layer 212, such that a part of the transparent conductive layer 22 disposed on the current blocking layers 28 is grown on the second semiconductor layer 212 and is electrically connected thereto. In the vertical direction, the third through holes 280 are staggered with the first through holes 230 of the Bragg reflective layer 23, such that the current blocking layers 28 correspond to the first through holes 230 and are not connected to each other. Therefore, after the current flows to the metal layer 24 from the second electrode 27 via the second through hole 250 and further flows to the transparent conductive layer 22, the current will be blocked by the current blocking layers 28 and cannot reach the second semiconductor layer 212 directly. For the current to reach the second semiconductor layer 212, the current must bypass the current blocking layers 28 and then flow through the third through holes 280. Since the current may be more uniformly distributed, the uniformity and luminance of the light emitted by the LED may be increased.

Figure 7:
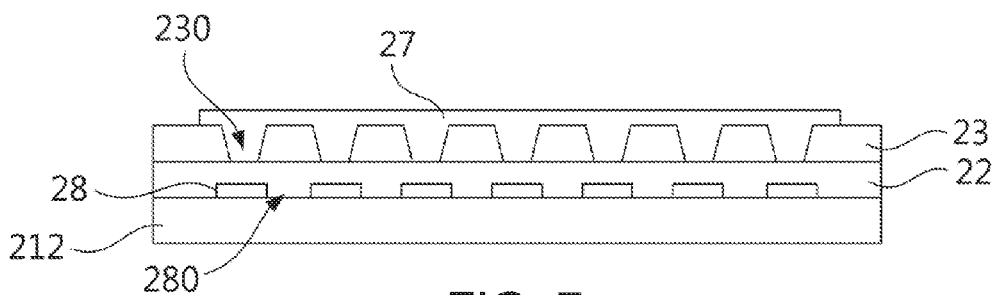
FIG. 7 is a partial structure diagram illustrating the uniformity of current distribution is enhanced by using current blocking layers but omitting metal layer and insulating layer according to another alternate embodiment of the present invention.
Figure 8A:
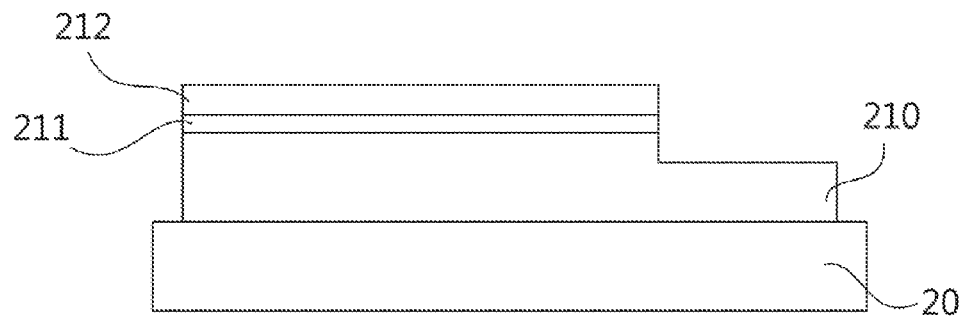
FIGS. 8A-8E are schematic diagrams of a manufacturing method of LED having distributed Bragg reflector according to an embodiment of the present invention.
Figure 8B:
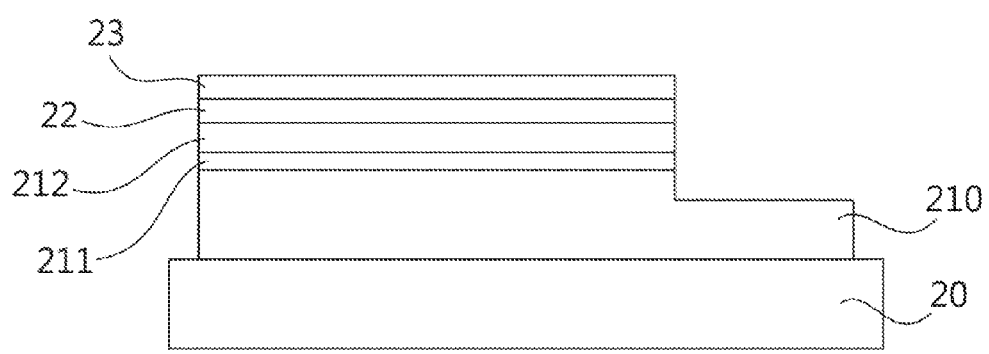
Figure 8C:
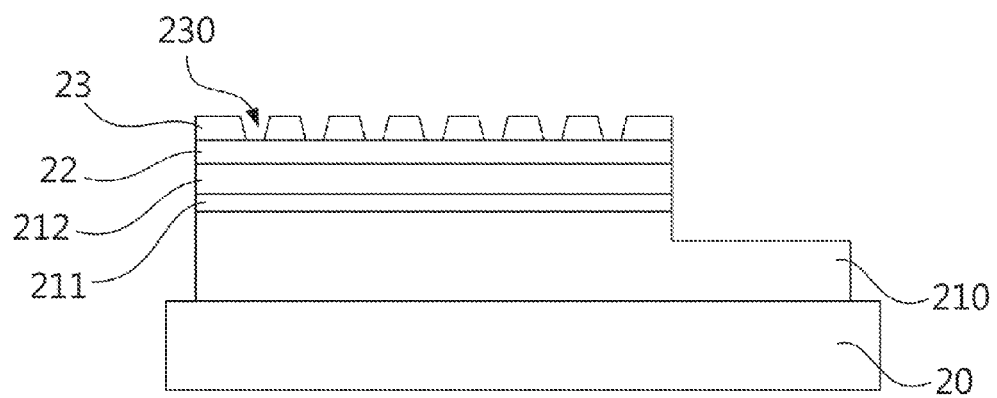
Figure 8D:
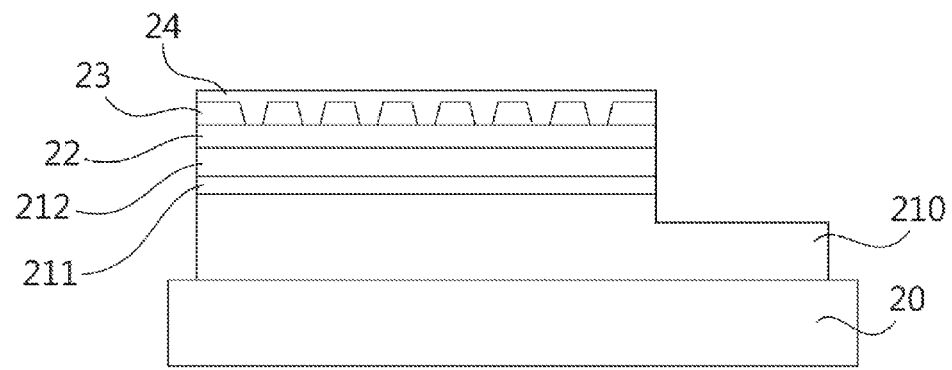
Figure 8E:
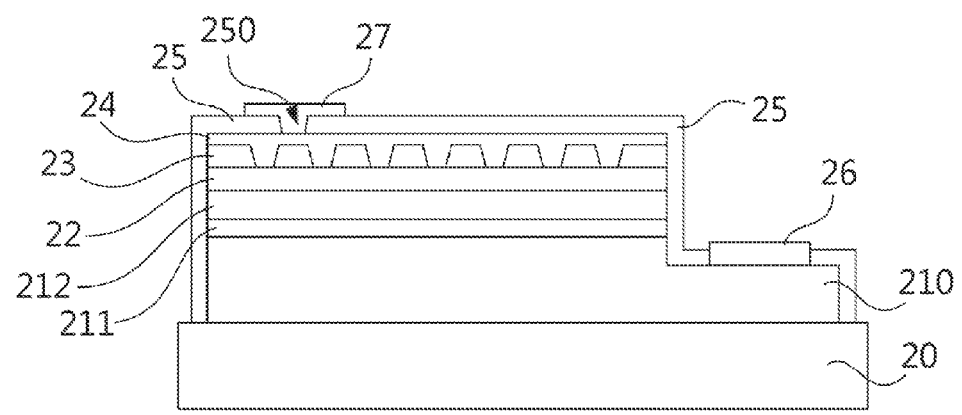

Referring to FIG. 7, another alternate embodiment for enhancing current diffusion is shown. As indicated in FIG. 7, the insulating layer 25 and the metal layer 24 are omitted. In addition to reflective function, the Bragg reflective layer 23 formed of an insulating material also provides insulating function like the insulating layer of the previous embodiment. Since the Bragg reflective layer may be formed of an insulating material and provide insulating function like the insulating layer of the previous embodiment, the insulating layer of the previous embodiment is replaced by the Bragg reflective layer and is omitted in the present embodiment. As indicated in the structure of the present embodiment, after the current blocking layers 28 of the previous embodiment are disposed on the second semiconductor layer 212, the transparent conductive layer 22 is grown on the current blocking layers 28, such that the transparent conductive layer 22 may contact and become electrically connected with the second semiconductor layer 212 via a plurality of third through holes 280 penetrating through the current blocking layers 28. Since the third through holes 280 are formed by etching the current blocking layers 28, one single current blocking layer may be divided into a plurality of current blocking layers 28 separated from each other. Then, at least one Bragg reflective layer 23 is grown on the transparent conductive layer 22, and a plurality of first through holes 230 penetrating through the Bragg reflective layer 23 are formed using the photoresist lift-off process to expose a part of the transparent conductive layer 22. Lastly, the second electrode 27 is disposed on the Bragg reflective layer 23, such that the second electrode 27 may contact and electrically connect with the transparent conductive layer 22 via the first through holes 230. As indicated in the structure of the present embodiment, in the vertical direction, the third through holes 280 are staggered with the first through holes 230 in the Bragg reflective layer 23 (such that the current blocking layers 28 are disposed corresponding to the first through holes 230). Therefore, after the current flows to the transparent conductive layer 22 from the second electrode 27 via the first through holes 230 and further flows to the transparent conductive layer 22, the current will be blocked by the current blocking layers 28 and cannot reach the second semiconductor layer 212 directly. For the current to reach the second semiconductor layer 212, the current must bypass the current blocking layers 28 and flow via the third through holes 280. Since the current may be more uniformly distributed, the uniformity and luminance of the light emitted by the LED may be increased like the previous embodiment.

Referring to FIGS. 8A-8E, schematic diagrams of a manufacturing method of LED having distributed Bragg reflector according to an embodiment of the present invention are shown. The manufacturing method includes following steps.

In step S1, an epitaxial layer having a first semiconductor layer, a light emitting layer and a second semiconductor layer is grown.

In step S2, a transparent conductive layer is grown on the second semiconductor layer.

In step S3, a Bragg reflective layer is grown on the transparent conductive layer.

In step S4, a plurality of first through holes penetrating through the Bragg reflective layer are formed.

In step S5, a metal layer is grown on the Bragg reflective layer and is electrically connected to the transparent conductive layer via the first through holes.

In step S6, an insulating layer is grown on the metal layer.

In step S7, at least one second through hole is formed in the insulating layer to expose a part of the metal layer.

In the above steps, the transparent substrate 20 may be realized by a sapphire substrate, and the transparent conductive layer 22 may be formed of a material selected from indium tin oxide (ITO) or indium zinc oxide (IZO), such that the transparent conductive layer 22 formed of the selected material may have a transmittance larger than 98% and have an Ohmic contact with the second semiconductor layer. The metal layer 24, formed of an element such as chromium, gold, platinum, titanium or aluminum, may be a film structure covering the Bragg reflective layer 23 by sputtering. The current may flow through the metal layer 24 which may be served as an extension of the electrode for diffusing the currents. Additionally, the metal layer 24 may bond the upper layer and the lower layer together. For example, in the present embodiment, the metal layer 24 is bonded with the transparent conductive layer. Also, the metal layer 24 provides reflective function. The insulating layer 25 may be formed of silica. After the insulating layer 25 covers the metal layer 24, the second through holes 250 are formed in the insulating layer 25 by way of etching to expose the metal layer 24, such that the second electrode 27 may contact with the metal layer 24 to conduct the current. The insulating layer 25 also covers a side surface of the epitaxial layer and the top surface of a part of the first semiconductor layer 212. Variations of the structure exemplified above, such as integration of the insulating layer and the Bragg reflective layer or adjustment in the stacking sequence of the transparent conductive layer, the metal layer and the Bragg reflective layer, may be performed by increasing or decreasing the growth of corresponding layer according to actual needs and forming through holes or gaps by way of etching for the current to flow through.

Figure 9:
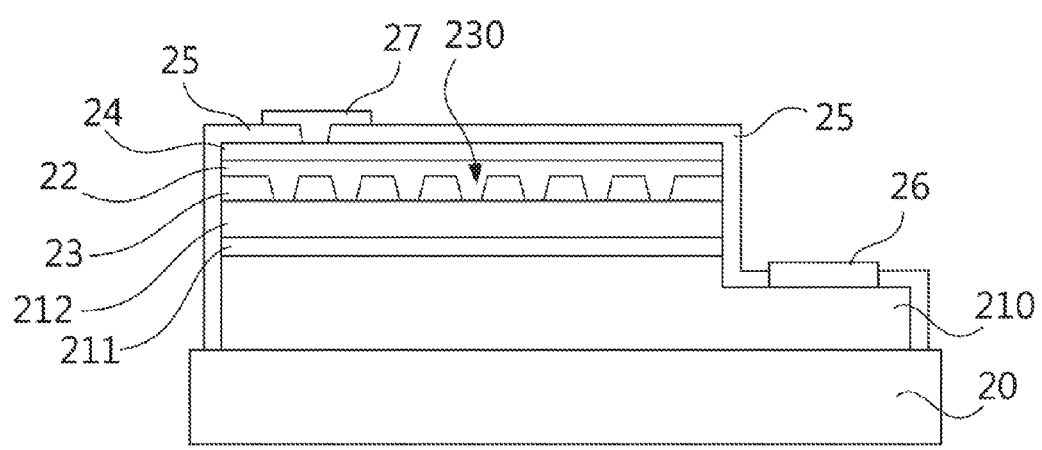
FIG. 9 is a partial structure diagram of a transparent conductive layer being interposed between a Bragg reflective layer and a metal layer according to another alternate embodiment of the present invention.

Referring to FIG. 9, an alternate embodiment of the present invention is shown. A Bragg reflective layer 23 is disposed on the second semiconductor layer 212, and a plurality of first through holes 230 penetrating through the Bragg reflective layer 23 are formed using the photoresist lift-off process to expose a part of the second semiconductor layer 212. A transparent conductive layer 22 is disposed on the Bragg reflective layer 23. The transparent conductive layer 22 may contact the second semiconductor layer 212 via the first through holes 230. A metal layer 24 is disposed on the transparent conductive layer 22 and has an Ohmic contact with the transparent conductive layer 22.

According to the LED having distributed Bragg reflector and the manufacturing method thereof disclosed in the present invention, conventional silver mirror is replaced with distributed Bragg reflector, not only dispensing with the disposition of a barrier layer normally formed of titanium tungsten and used for preventing silver diffusion, but also decreasing manufacturing steps, avoiding unstable factors and increasing product yield. Moreover, the distributed Bragg reflector provides a high reflectivity such that the uniformity and luminance of the light emitted by the LED may be increased. To summarize, the LED having distributed Bragg reflector and the manufacturing method thereof of the present invention indeed are practical and have high commercial value.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A light emitting diode (LED) having distributed Bragg reflector, comprising:
   an epitaxial layer having a first semiconductor layer, a light emitting layer and a second semiconductor layer, wherein the light emitting layer is interposed between the first semiconductor layer and the second semiconductor layer;
   a transparent conductive layer disposed on the second semiconductor layer;
   a Bragg reflective layer disposed on the transparent conductive layer and having a plurality of first through holes penetrating through the Bragg reflective layer;
   a first electrode electrically connected to the first semiconductor layer;
   a second electrode electrically connected to the transparent conductive layer; and
   a plurality of intervals in adjoining through holes of the plurality of first through holes and a plurality of distances between the plurality of first through holes and the second electrode, wherein the plurality of intervals gradually decrease as the plurality of distances gradually increase.

2. The LED having distributed Bragg reflector according to claim 1, further comprising:
   a metal layer disposed on the Bragg reflective layer; and
   an insulating layer disposed on the metal layer and having a second through hole exposing a part of the metal layer, wherein the second electrode is disposed on the insulating layer and electrically connected to the metal layer via the second through hole.

3. The LED having distributed Bragg reflector according to claim 1, further comprising a plurality of current blocking layers disposed on the second semiconductor layer and corresponding to the plurality of first through holes.

4. An LED having distributed Bragg reflector, comprising:
   an epitaxial layer having a first semiconductor layer, a light emitting layer and a second semiconductor layer;
   a plurality of current blocking layers disposed on the second semiconductor layer;
   a transparent conductive layer disposed on the plurality of current blocking layers and the second semiconductor layer;
   a Bragg reflective layer disposed on the transparent conductive layer and having a plurality of first through holes penetrating the Bragg reflective layer and corresponding to the plurality of current blocking layers to expose a part of the transparent conductive layer;
   a first electrode electrically connected to the first semiconductor layer;
   a second electrode disposed on the Bragg reflective layer and electrically connected to the transparent conductive layer via the plurality of first through holes; and
   a plurality of intervals in adjoining through holes of the plurality of first through holes and a plurality of distances between the plurality of first through holes and the second electrode, wherein the plurality of intervals gradually decrease as the plurality of distances gradually increase.

* * * * *